(12) United States Patent
Kim et al.

(10) Patent No.: US 10,624,209 B2
(45) Date of Patent: Apr. 14, 2020

(54) FLEXIBLE PRINTED CIRCUIT BOARD

(71) Applicant: GIGALANE CO., LTD., Hwaseong-si, Gyeonggi-do (KR)

(72) Inventors: Ik Soo Kim, Hwaseong-si (KR); Byung Yeol Kim, Hwaseong-si (KR); Sang Pil Kim, Hwaseong-si (KR); Byung Hoon Jo, Hwaseong-si (KR); Da Yeon Lee, Hwaseong-si (KR); Hwang Sub Koo, Hwaseong-si (KR); Hyun Je Kim, Hwaseong-si (KR); Hee Seok Jung, Hwaseong-si (KR)

(73) Assignee: GIGALANE CO., LTD., Hwaseong-si, Gyeonggi-Do (KR)

( * ) Notice: Subject to any disclaimer, the term of this patent is extended or adjusted under 35 U.S.C. 154(b) by 0 days.

(21) Appl. No.: 16/077,070

(22) PCT Filed: Feb. 6, 2017

(86) PCT No.: PCT/KR2017/001249
§ 371 (c)(1),
(2) Date: Aug. 10, 2018

(87) PCT Pub. No.: WO2017/146394
PCT Pub. Date: Aug. 31, 2017

(65) Prior Publication Data
US 2019/0045630 A1    Feb. 7, 2019

(30) Foreign Application Priority Data

Feb. 26, 2016 (KR) .......................... 10-2016-0022978

(51) Int. Cl.
*H05K 1/11*    (2006.01)
*H05K 3/46*    (2006.01)
(Continued)

(52) U.S. Cl.
CPC ........... *H05K 1/118* (2013.01); *H05K 1/0221* (2013.01); *H05K 1/189* (2013.01); *H05K 3/46* (2013.01);
(Continued)

(58) Field of Classification Search
CPC .......... H05K 1/118; H05K 1/189; H05K 1/18; H05K 1/11; H05K 1/02; H05K 2201/05; H05K 3/46
See application file for complete search history.

(56) References Cited

U.S. PATENT DOCUMENTS 4,845,311 A * 7/1989 Schreiber .................. H01P 3/06
174/36
7,429,702 B2 * 9/2008 Kobayashi ........... H05K 1/0219
174/117 FF
(Continued)

FOREIGN PATENT DOCUMENTS

DE    7132203 U    3/1980
EP    2590485 A1   5/2013
(Continued)

OTHER PUBLICATIONS

International Search Report and Written Opinion for PCT/KR2017/001249 dated Apr. 28, 2017, 18 pages.

*Primary Examiner* — Nathan Milakovich
(74) *Attorney, Agent, or Firm* — Brundidge & Stanger, P.C.

(57) ABSTRACT

A flexible printed circuit board is introduced. The flexible printed circuit board of the present invention has a first substrate part, comprising a first signal line, and a second substrate part, comprising a second signal line that is parallel to the first signal line, arranged on the same plane while having a shielding part interposed therebetween.

16 Claims, 8 Drawing Sheets

(51) Int. Cl.
*H05K 1/02* (2006.01)
*H05K 1/18* (2006.01)

(52) U.S. Cl.
CPC .......... *H05K 1/024* (2013.01); *H05K 1/0225* (2013.01); *H05K 3/4635* (2013.01); *H05K 3/4697* (2013.01); *H05K 2201/05* (2013.01); *H05K 2201/09236* (2013.01); *H05K 2201/09618* (2013.01); *H05K 2201/10098* (2013.01)

(56) References Cited

U.S. PATENT DOCUMENTS

| | | | | |
|---|---|---|---|---|
| 8,013,254 B2* | 9/2011 | Lee | ............. | H05K 1/0224 174/254 |
| 8,198,545 B2* | 6/2012 | Lee | ............. | H01P 3/087 174/255 |
| 10,299,375 B2* | 5/2019 | Kim | ............. | H05K 1/024 |
| 10,365,687 B2* | 7/2019 | Kim | ............. | H05K 5/0086 |
| 2004/0040739 A1* | 3/2004 | Yoshimura | ............. | H05K 1/0221 174/255 |
| 2005/0237137 A1 | 10/2005 | Dutta | | |
| 2009/0000804 A1* | 1/2009 | Kobayashi | ............. | H01P 3/003 174/117 F |
| 2010/0182105 A1* | 7/2010 | Hein | ............. | H01P 3/003 333/239 |
| 2010/0307798 A1* | 12/2010 | Izadian | ............. | H01L 24/24 174/255 |
| 2011/0121922 A1* | 5/2011 | Blair | ............. | H01P 3/00 333/238 |
| 2012/0132458 A1* | 5/2012 | Sekine | ............. | H05K 1/0393 174/254 |
| 2014/0111684 A1* | 4/2014 | Corbin | ............. | H01Q 1/243 348/374 |
| 2014/0376199 A1* | 12/2014 | Kato | ............. | H01P 3/085 361/753 |
| 2015/0319847 A1* | 11/2015 | Kim | ............. | H05K 1/0216 174/264 |
| 2017/0084974 A1* | 3/2017 | Baba | ............. | H01P 3/088 |
| 2017/0084975 A1* | 3/2017 | Baba | ............. | H01P 3/08 |
| 2017/0187087 A1* | 6/2017 | Baba | ............. | H05K 1/0251 |
| 2018/0053981 A1* | 2/2018 | Bae | ............. | H01P 3/085 |
| 2018/0206332 A1* | 7/2018 | Kim | ............. | H05K 1/115 |
| 2018/0206335 A1* | 7/2018 | Kim | ............. | H05K 3/28 |
| 2019/0041907 A1* | 2/2019 | Kim | ............. | G06F 1/1618 |
| 2019/0053379 A1* | 2/2019 | Kim | ............. | H01P 3/08 |
| 2019/0088388 A1* | 3/2019 | Baba | ............. | H01B 7/18 |

FOREIGN PATENT DOCUMENTS

| | | | |
|---|---|---|---|
| JP | 2004201000 A | | 7/2004 |
| JP | 2004247616 A | | 9/2004 |
| JP | 2006024618 A | * | 1/2006 |
| JP | 2010530690 A | | 9/2010 |
| JP | 2011518437 A | | 6/2011 |
| JP | 2013251165 A | | 12/2013 |
| KR | 1020090110444 A | | 10/2009 |
| KR | 1020090133072 A | | 12/2009 |
| KR | 1020100005616 A | | 1/2010 |
| KR | 101416159 B1 | | 7/2014 |
| WO | 2014115607 A1 | | 7/2014 |
| WO | 2014178295 A1 | | 11/2014 |

* cited by examiner

FLEXIBLE PRINTED CIRCUIT BOARD

CROSS-REFERENCE TO RELATED APPLICATION

This Application is the National Stage filing under 35 U.S.C. § 371 of PCT Application Ser. No. PCT/KR2017/001249 filed on Feb. 06, 2017, which claims the benefit of Korean Patent Application No. 10-2016-0022978 filed on Feb. 26, 2016. The disclosures of both applications are hereby incorporated herein by reference in their entireties.

TECHNICAL FIELD

The present disclosure relates to a flexible printed circuit board.

BACKGROUND ART

A radio frequency (RF) signal line is provided in a terminal such as a mobile phone, a tablet PC, a notebook, and the like. The RF signal line according to the related art is mounted in the form of a coaxial cable. In the case of being mounted in the form of the coaxial cable, it is general that the flexible printed circuit board is used in recent years because the space utilization in the wireless terminal is deteriorated.

With the development of communication technology, two or more RF signal lines are used for transmitting a short distance communication signal such as WIFI and/or a wireless mobile communication signal such as 3G and 4G.

As described above, when the coaxial connector is used as each of the RF signal lines to prevent signals from interfering with each other, a space occupied by the thickness of the coaxial connector itself and a fixing body for fixing he coaxial connector increases in the wireless terminal. To solve such the spatial problem, there is a need to use the flexible printed circuit board.

However, when the flexible printed circuit board is used, since the RF signal lines different from each other have to be spaced apart from each other so as to solve the signal interference problem, there is also a limitation in solving the spatial problem within the wireless terminal.

It should be understood that the foregoing description of the background art is merely for the purpose of promoting a better understanding of the background of the present invention, and is not to be construed as admission that the prior art is known to those skilled in the art.

DISCLOSURE OF THE INVENTION

Technical Problem

An object of the present invention is to provide a flexible printed circuit board in which a signal interference and a signal loss are minimized to be optimized for a wireless terminal such as a notebook while a plurality of signal lines are arranged on a plane in parallel to each other to realize a thin thickness.

Technical Solution

To achieve this object, a flexible printed circuit board according to the present invention includes: a first substrate part including a first signal line; and a second substrate part including a second signal line parallel to the first signal line, wherein the first substrate part and the second substrate part are disposed on the same plane with a shielding part therebetween.

The flexible printed circuit board may further include: a first dielectric layer; a second dielectric layer disposed to be spaced a predetermined distance from the first dielectric layer in a vertical direction; a pair of first side grounds laminated to be spaced a predetermined from each other on a bottom surface of the first dielectric layer; a pair of second side grounds laminated to be spaced a predetermined from each other on a plane of the second dielectric layer; a first central ground disposed between the pair of first side grounds and laminated on the bottom surface of the first dielectric layer; and a second central ground disposed between the pair of second side grounds and laminated on the plane of the second dielectric layer, wherein the first signal line and the second signal line may be disposed with the first central ground and the second central ground therebetween.

The first signal line may be disposed between each of the second side grounds and the second central ground and formed on the plane of the second dielectric layer, and the second signal line may be disposed between each of the first side grounds and the first central ground and formed on the bottom surface of the first dielectric layer.

A first ground layer may be laminated on a plane of the first dielectric layer, a second ground layer may be laminated on a bottom surface of the second dielectric layer, and facing surfaces of the first dielectric layer and the second dielectric layer, the first central ground and the second central ground, and the first side ground and the second side ground may be coupled to each other by using a coupling part as a medium.

A first ground layer may be laminated on a plane of the first dielectric layer, a second ground layer may be laminated on a bottom surface of the second dielectric layer, and the first central ground and the second central ground, and the first side ground and the second side ground may be coupled to each other by using a coupling part as a medium, wherein an air layer may be formed in a space through which the first dielectric layer and the second dielectric layer face each other so that the first signal line and the second signal line are exposed to the air layer.

The flexible printed circuit board according to the present invention may further include: a first dielectric layer; a second dielectric layer disposed to be spaced a predetermined distance from the first dielectric layer in a vertical direction; a third dielectric layer spaced a predetermined distance from the second dielectric layer in the vertical direction, wherein the third dielectric layer and the second dielectric layer are disposed with the first dielectric layer therebetween; a pair of first side grounds laminated to be spaced a predetermined from each other on a plane of the first dielectric layer; a pair of second side grounds laminated to be spaced a predetermined from each other on a bottom surface of the first dielectric layer; a first central ground disposed between the pair of first side grounds and laminated on the plane of the first dielectric layer; and a second central ground disposed between the pair of second side grounds and laminated on the bottom surface of the first dielectric layer, wherein the first signal line and the second signal line may be disposed with the first central ground and the second central ground therebetween.

The first signal line may be disposed between the second side ground and the second central ground and formed on the bottom surface of the first dielectric layer, and the second signal line may be disposed between the first side ground and the first central ground and formed on the plane of the first dielectric layer.

A first ground layer may be laminated on a plane of the second dielectric layer, a second ground layer may be laminated on a bottom surface of the third dielectric layer, facing surfaces of the first dielectric layer and the second dielectric layer, facing surfaces of the first central ground and the second dielectric layer, facing surfaces of the first side ground and the second dielectric layer, and facing surfaces of the second signal line and the second dielectric layer may be coupled to each other by using a first coupling part as a medium, and facing surfaces of the first dielectric layer and the third dielectric layer, facing surfaces of the second central ground and the third dielectric layer, facing surfaces of the second side ground and the third dielectric layer, and facing surfaces of the first signal line and the third dielectric layer may be coupled to each other by using a second coupling part as a medium.

A first ground layer may be laminated on a plane of the second dielectric layer, a second ground layer may be laminated on a bottom surface of the third dielectric layer, and an air layer may be formed between the first dielectric layer on which the first signal line is formed and the third dielectric layer and between the first dielectric layer on which the second signal line is formed and the second dielectric layer so that the first signal line and the second signal line are exposed to the air layer.

The first substrate part and the second substrate part may be divided with respect to the first central ground and the second central ground.

The flexible printed circuit board may further include: a first via hole formed to pass through the first substrate part in the vertical direction; a second via hole formed to pass through the second substrate part in the vertical direction; and third and fourth via holes passing through the shielding part in the vertical direction and formed to be spaced a predetermined distance from each other in a width direction.

The first via hole to the fourth via hole may be disposed on the same line in the width direction.

The first via hole and the third via hole may be disposed on the same first line in the width direction, the second via hole and the fourth via hole may be disposed on the same second line in the width direction, and the first line and the second line may be formed to alternate with each other.

A plurality of circular ground holes may be formed to be spaced a predetermined distance from each other in a longitudinal direction of the first signal line in the first ground layer disposed on the plane of the first signal line, a plurality of rectangular ground holes may be formed to be spaced a predetermined distance from each other in a longitudinal direction of the second signal line in the first ground layer disposed on the plane of the second signal line, a plurality of rectangular ground holes may be formed to be spaced a predetermined distance from each other in the longitudinal direction of the first signal line in the second ground layer disposed on the bottom surface of the first signal line, and a plurality of circular ground holes may be formed to be spaced a predetermined distance from each other in the longitudinal direction of the second signal line in the second ground layer disposed on the bottom surface of the second signal line.

A coaxial cable may be connected to one end of each of the first signal line and the second signal line.

The other end of each of the first signal line and the second signal line may extend in a left and right direction to form a "T" shape.

A first antenna and a second antenna may be coupled to both ends that are formed to extend from the other end in the left and right direction.

A first antenna and a second antenna may be formed to extend from both the ends in the left and right direction.

Advantageous Effects

According to the present invention, the following various effects can be realized.

First, the plurality of signal lines may be arranged on the plane in parallel to each other to realize the thin thickness.

Second, the signal interference occurring between the first signal line and the second signal line may be minimized.

Third, the signal loss may be minimized

MODE FOR CARRYING OUT THE INVENTION

Figure 1:
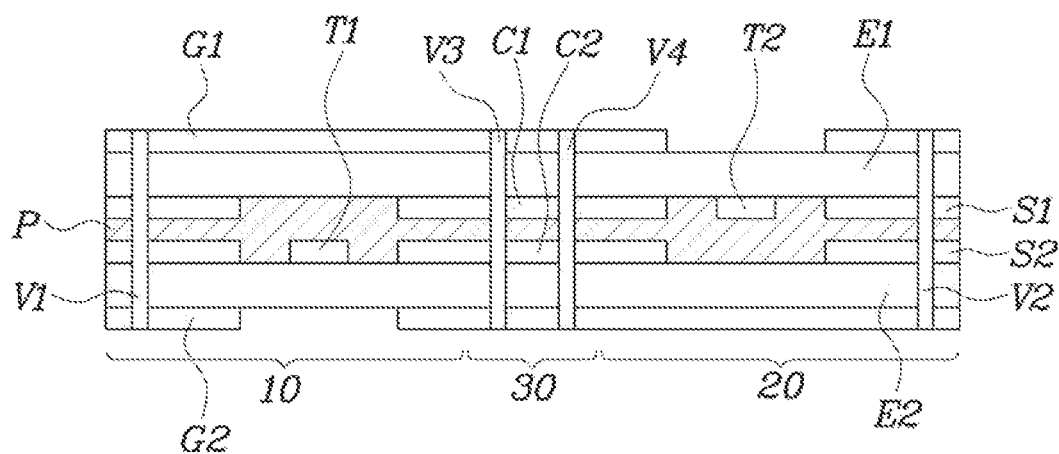
FIG. 1 is a cross-sectional view of a flexible printed circuit board according to a first embodiment of the present invention.

The objectives, specific advantages, and novel features of the present invention will become more apparent from the following detailed description and embodiments taken in conjunction with the accompanying drawings. It should be noted that the reference numerals are added to the components of the drawings in the present specification with the same numerals as possible, even if they are illustrated in other drawings. Also, it will be understood that although the terms such as 'first' and 'second' are used herein to describe various elements, these elements should not be limited by these terms. The terms are only used to distinguish one component from other components. Moreover, detailed descriptions related to well-known functions or configurations will be ruled out in order not to unnecessarily obscure subject matters of the present disclosure.

Hereinafter, specific embodiments will be described in detail with reference to the accompanying drawings.

FIG. 1 is a cross-sectional view of a flexible printed circuit board according to a first embodiment of the present invention.

As illustrated in FIG. 1, the flexible printed circuit board according to the present invention includes a first substrate part 10, a second substrate part 20, and a shielding part 30.

The first substrate part 10 and the second substrate part 20 are disposed on the same plane with the shielding part 30 therebetween. Thus, a first signal line T1 formed on the first substrate part 10 and a second signal line T2 formed on the second substrate part 20 are disposed in parallel to each other.

As described above, since the first substrate part 10 and the second substrate part 20 are disposed on the same plane, the flexible printed circuit board according to the present invention may be realized with a thin thickness. Since the first signal line T1 and the second signal line T2 are disposed with the shielding part 30 therebetween, a signal loss due to mutual signal interference may be minimized The flexible printed circuit board according to the present invention may include a first dielectric layer E1, a second dielectric layer E2, a pair of first side grounds S1, a pair of second side grounds S2, a first central ground C1, and a second central ground C2.

The first dielectric layer E1 and the second dielectric layer E2 are disposed in parallel to be spaced a predetermined distance from each other in a vertical direction and have shape corresponding to each other.

The pair of first side grounds S1 are laminated to be spaced a predetermined distance from each other on a bottom surface of the first dielectric layer E1, and the pair of second side grounds S2 are laminated to be spaced a predetermined distance from each other on a plane of the second dielectric layer E2.

The bottom surface of the first dielectric layer E1 and the plane of the second dielectric layer E2 may face each other, bottom surfaces of the pair of first side grounds S1 and planes of the pair of second side grounds S2 may also face each other and be spaced a predetermined distance from each other in the vertical direction.

The first central ground C1 is laminated on the bottom surface of the first dielectric layer E1 and disposed between the pair of first side grounds S1, and the second central ground C2 is laminated on the plane of the second dielectric layer E2 and disposed between the pair of second side grounds S2. The first central ground C1 and the second central ground C2 have shapes corresponding to each other and are disposed in parallel to be spaced a predetermined distance from each other in the vertical direction.

As described above, the first substrate part 10 on which the first signal line T1 is formed and the second substrate part 20 on which the second signal line T2 is formed are disposed on the same plane with the shielding part 30 therebetween. Here, one region may be defined as the first substrate part 10, and the other region may be defined as the second substrate part 20 with respect to a region in which the first central ground C1 and the second central ground C2 are disposed. The shielding part 30 may be defined as the region in which the first central ground C1 and the second central ground C2 are disposed.

Here, the first central ground C1 and the second central ground C2 may extend to the regions of the first substrate part 10 and the second substrate part 20 as well as the region of the shielding part 30.

The first signal line T1 and the second signal line T2 are disposed with the above-described first central ground C1 and second central ground C2 therebetween to prevent signal interference occurring between the first signal line T1 and the second signal line T2 from occurring.

Figure 3:
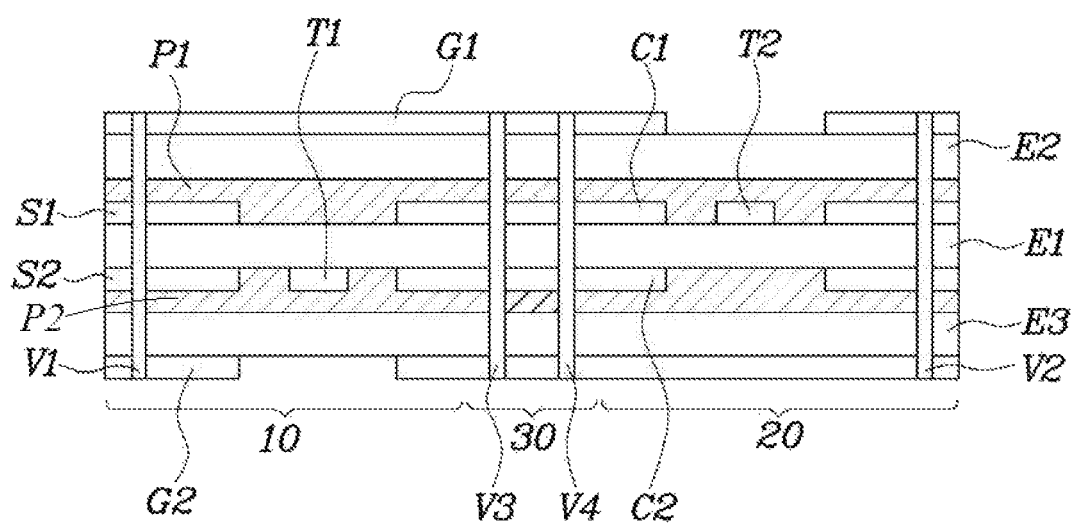
FIG. 3 is a cross-sectional view of a flexible printed circuit board according to a third embodiment of the present invention.

Also, although the first signal line T1 is formed on the plane of the second dielectric layer E2, and the second signal line T2 is formed on the bottom surface of the first dielectric layer E1 in FIG. 3, the arrangement structure of the first signal line T1 and the second signal line T2 may be variously changed depending on designer's intension.

The bottom surface of the first dielectric layer E1 and the plane of the second dielectric layer E2, facing surfaces of the first central ground C1 and the second central ground C2, facing surfaces of the first side ground S1 and the second side ground S2, facing surfaces of the first signal line T1 and the first dielectric layer E1, and facing surfaces of the second signal line T2 and the second dielectric layer E2 may be coupled to each other by using a coupling part P as a medium.

The coupling part P may be a dielectric that is deformed during high-temperature press coupling or an adhesion medium such as a bonding sheet. The structure of the coupling part P may be variously deformed and applied depending on designer's intension.

Figure 2:
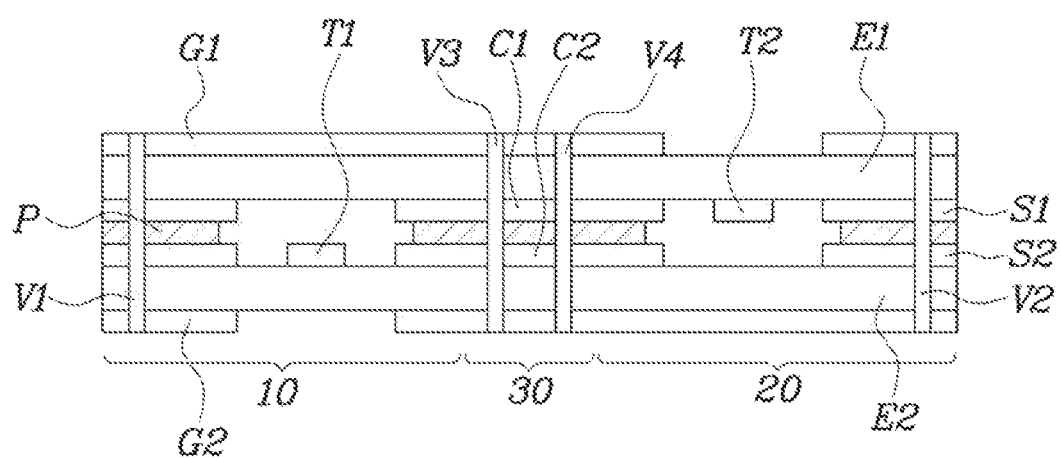
FIG. 2 is a cross-sectional view of a flexible printed circuit board according to a second embodiment of the present invention.

As illustrated in FIG. 2, a flexible printed circuit board according to a second embodiment of the present invention is the same as that according to the foregoing first embodiment except for an installation region of a coupling part P.

In description of the flexible printed circuit board according to the second embodiment of the present invention, descriptions with respect to other components except for the coupling part P will be derived from those of the flexible printed circuit board according to the foregoing first embodiment, and thus, the installation region of the coupling part P, which is different from that of the coupling part according to the first embodiment, will be mainly described below.

The coupling part P is installed so that the first signal line T1 and the second signal line T2 are exposed to an air layer. That is, only the facing areas of the first side ground S1 and the second side ground S2 and the facing areas of the first central ground C1 and the second central ground C2 are coupled to each other by using the coupling part P as a medium.

The air layer may be formed between the facing surfaces of the first dielectric layer E1 and the second dielectric layer E2, and the first signal line T1 and the second signal line T2 may be exposed to the air layer having a low dielectric constant. Thus, capacitance may be reduced to minimize a signal loss.

Although the two-layered dielectric layer structure according to the first and second embodiments are applied to the flexible printed circuit board according to the present invention, a three-layered dielectric layer structure according to third and fourth embodiments may be applied to the flexible printed circuit board according to the present invention.

In the flexible printed circuit board according to the third and fourth embodiments of the present invention, a first substrate part 10 and a second substrate part 20 may also be disposed on the same plane with a shielding part 30 therebetween. Hereinafter, this specific configuration will be described.

As illustrated in FIG. 3, the flexible printed circuit board according to the third embodiment of the present invention may include a first dielectric layer E1, a second dielectric layer E2, a third dielectric layer E3, a pair of first side grounds S1, a pair of second side grounds S2, a first central ground C1, and a second central ground C2.

The second dielectric layer E2 is disposed to be spaced a predetermined distance from each other upward, and the third dielectric layer E3 is disposed to be spaced a predetermined distance from each other downward with respect to the first dielectric layer E1. The first dielectric layer E1, the second dielectric layer E2, and the third dielectric layer E3 are formed in parallel to each other with shapes corresponding to each other.

Also, the pair of first side grounds S1 are laminated to be spaced a predetermined distance from each other on a plane of the first dielectric layer E1, and the pair of second side grounds S2 are laminated to be spaced a predetermined distance from each other on a bottom surface of the second dielectric layer E2.

The first side ground S1 and the second side ground S2 may have the same shape and the same area. This will be variously deformed and used depending on designer's intension.

The first central ground C1 is disposed between the pair of first side grounds S1 and laminated on a plane of the first dielectric layer E1, and the second central ground C2 is disposed between the pair of second side grounds S2 and laminated on a bottom surface of the first dielectric layer E1.

As described in the first and second embodiments of the present invention, in a third embodiment, one region may be defined as a first substrate part 10, and the other region may be defined as a second substrate part 20 with respect to a region in which the first central ground C1 and the second central ground C2 are disposed. A shielding part 30 may be defined as the region in which the first central ground C1 and the second central ground C2 are disposed.

Here, the first central ground C1 and the second central ground C2 may extend to the regions of the first substrate part 10 and the second substrate part 20 as well as the region of the shielding part 30.

The first signal line T1 is disposed between the second side ground S2 disposed at one side of the first dielectric layer E1 and the second central ground C2, and the second signal line T2 is disposed between the first side ground S1 disposed at the other side of the first dielectric layer E1 and the first central ground C1. That is, signal interference occurring between the first signal line T1 and the second signal line T2 may be prevented by the first central ground C1 and the second central ground C2.

Also, in the case of the three-layered dielectric layer structure, the signal interference occurring due to other components disposed on upper and lower portions of the flexible printed circuit board may be prevented.

In the flexible printed circuit board according to the third embodiment of the present invention, facing surfaces of the first dielectric layer E1 and the second dielectric layer E2, facing surfaces of the first central ground C1 and the second dielectric layer E2, facing surface of the first side ground S1 and the second dielectric layer E2, and facing surface of the second signal line T2 and the second dielectric layer E2 are coupled to each other by using a first coupling part P1 as a medium, and facing surface of the first dielectric layer E1 and the third dielectric layer E3, facing surface of the second central ground C2 and the third dielectric layer E3, facing surface of the second side ground S2 and the third dielectric layer E3, and facing surface of the first signal line T1 and the third dielectric layer E3 may be coupled to each other by using the second coupling part P2 as a medium.

Each of the first coupling part P1 and the second coupling part P2 may be a dielectric that is deformed during high-temperature press coupling or an adhesion medium such as a bonding sheet. The structures of the first coupling part P1 and the second coupling part P2 may be variously deformed and applied depending on designer's intension.

Figure 4:
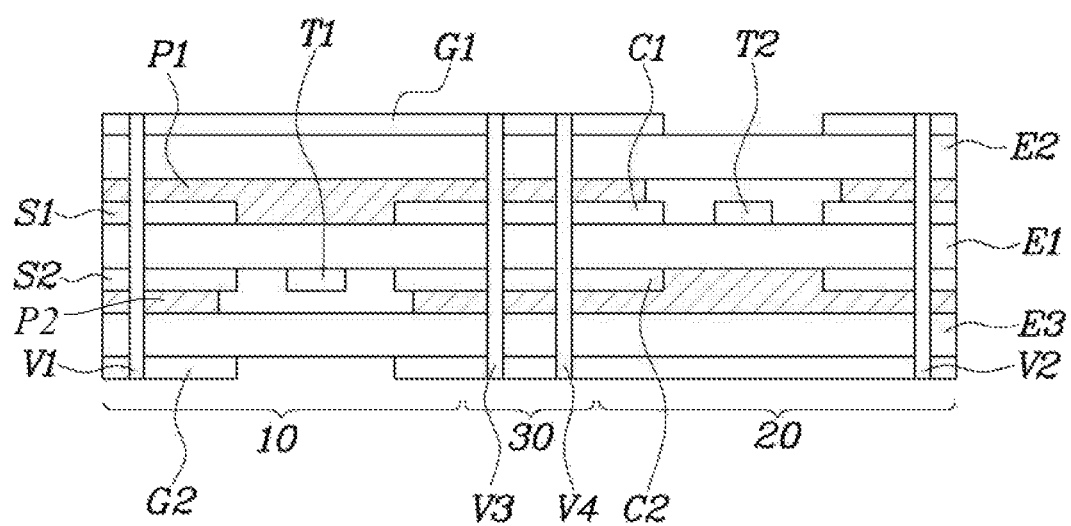
FIG. 4 is a cross-sectional view of a flexible printed circuit board according to a fourth embodiment of the present invention.

As illustrated in FIG. 4, a flexible printed circuit board according to a fourth embodiment of the present invention is the same as that according to the foregoing third embodiment except for installation regions of a first coupling part P1 and a second coupling part P2.

In description of the flexible printed circuit board according to the fourth embodiment of the present invention, descriptions with respect to other components except for the first coupling part P1 and the second coupling part P2 will be derived from those of the flexible printed circuit board according to the foregoing third embodiment, and thus, the installation regions of the first coupling part P1 and the second coupling part P2, which are different from those of the first coupling part P1 and the second coupling part P2 according to the third embodiment, will be mainly described below.

In the flexible printed circuit board according to the fourth embodiment of the present invention, a first substrate part 10 is disposed at one side of a shielding part 30, and a second substrate part 20 is disposed at the other side of the shielding part 30 with respect to the shielding part 30. A second signal ling T2 is disposed between a first central ground C1 of a region of the shielding part 30 and a first side ground S1 of a region of the second substrate part 20, and a first signal ling T1 is disposed between a second central ground C2 of the region of the first substrate part 10 and a second central ground C2 of the region of the shielding part 30.

The first coupling part P1 is disposed between a first dielectric layer E1 and a second dielectric layer E2 to couple the first and second dielectric layers E1 and E2 to each other, and the second coupling part P2 is disposed between the first dielectric layer E1 and a third dielectric layer E3 to couple the first and third dielectric layers E1 and E3 to each other.

Here, the second coupling part P2 is removed from the region in which the first signal line T1 of the first substrate part 10 is installed so that the first signal line T1 is exposed to an air layer, and the first coupling part P1 is removed from the region in which the second signal line T2 of the second substrate part 20 so that the second signal line T2 is exposed to the air layer.

In more detail, in the region of the first substrate part 10, the first side ground S1 and the second dielectric layer E2, the first dielectric layer E1 and the second electric layer E2, and the first central ground C1 and the second dielectric layer E2 are coupled to each other by using the first coupling part P1 as a medium. In the region of the shielding part 30, the first central ground C1 and the second dielectric layer E2 may also be coupled to each other by using the first coupling part P1 as the medium. In the region of the second substrate part 20, only the first central ground C1 and the second dielectric layer E2, and the first side ground S1 and the second dielectric layer E2 are coupled to each other by using the first coupling part P1 as the medium, and thus, the second signal line T2 is exposed to the air layer.

Also, in the region of the second substrate part 20, the second side ground S2 and the third dielectric layer E3, the first dielectric layer E1 and the third electric layer E3, and the second central ground C2 and the third dielectric layer E3 are coupled to each other by using the second coupling part P2 as a medium. In the region of the shielding part 30, the second central ground C2 and the third dielectric layer E3 may also be coupled to each other by using the second coupling part P2 as the medium. In the region of the first substrate part 10, only the second central ground C2 and the third dielectric layer E3, and the second side ground S2 and the third dielectric layer E3 are coupled to each other by using the second coupling part P2 as the medium, and thus, the first signal line T1 is exposed to the air layer.

As described above, the first signal line T1 and the second signal line T2 are exposed to the air layer having a low dielectric constant. Thus, capacitance may be reduced to minimize the signal loss.

As illustrated in FIGS. 1 to 4, a plurality of via holes V1, V2, V3, and V4 may be formed in the flexible printed circuit board according to the present invention.

As illustrated in FIGS. 3 and 4, in the flexible printed circuit board having the two-layered dielectric structure, the first ground layer G1 is laminated on a plane of the first dielectric layer E1, and the second ground layer G2 is laminated on a bottom surface of the second dielectric layer E2. Thus, the first via hole V1 is formed to pass through the region of the first substrate part 10 in a vertical direction, and the second via hole V2 is formed to pass through the region of the second substrate part 20 disposed at the other side with respect to the shielding part 30 in the vertical direction.

Also, the third via hole V3 and the fourth via hole V4 are formed to pass through the shielding part 30 and to be spaced a predetermined distance from each other in a width direction are formed in the shielding part 30.

The first via hole V1 and the second via hole V2 may pass through the first ground layer G1, the first dielectric layer E1, the first side ground S1, the coupling part P, the second side ground S2, and the second ground layer G2 so that the first side ground S1, the second side ground S2, the first ground layer G1, and the second ground layer G2 are electrically conducted.

The third via hole V3 and the fourth via hole V4 may pass through the first ground layer G1, the first dielectric layer E1, the first central ground C1, the coupling part P, the second central ground C2, the second dielectric layer E2, and the second ground layer G2 so that the first central ground C1, the second central ground C2, the first ground layer G1, and the second ground layer G2 are electrically conducted.

As illustrated in FIGS. 3 and 4, in the flexible printed circuit board having the three-layered dielectric structure, the first via hole V1, the second via hole V2, the third via hole V3, and the fourth via hole V4 may be formed. As described above, the first via hole V1 may be formed in the region of the first substrate part 10, the second via hole may be formed in the region of the second substrate part 20, and the third via hole V3 and the fourth via hole V4 may be formed in the region of the shielding part 30.

The first via hole V1 and the second via hole V2 may pass through the first ground layer G1, the second dielectric layer E2, the coupling part P1, the first side ground S1, the first dielectric layer E1, the second side ground S2, the second coupling part P2, the third dielectric layer E3, and the second ground layer G2 so that the first side ground S1, the second side ground S2, the first ground layer G1, and the second ground layer G2 are electrically conducted.

The third via hole V3 and the fourth via hole V4 may pass through the first ground layer G1, the second dielectric layer E2, the first coupling part P1, the first central ground C1, the first dielectric layer E1, the second central ground C2, the second coupling part P2, the third dielectric layer E3, and the second ground layer G2 so that the first central ground C1, the second central ground C2, the first ground layer G1, and the second ground layer G2 are electrically conducted.

Figure 5:
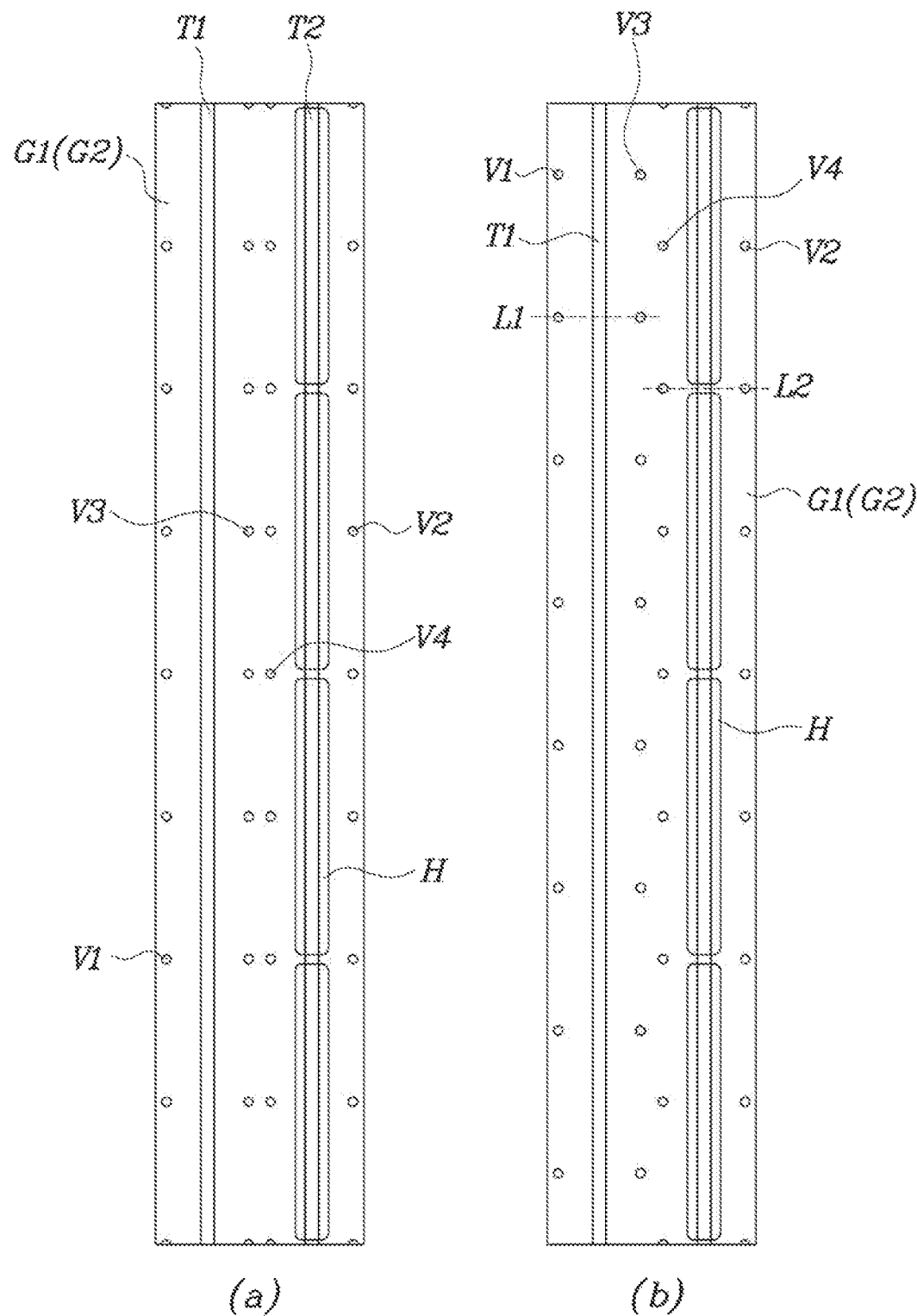
FIGS. 5(a) and 5(b) are views illustrating a via hole of a flexible printed circuit board according to different embodiments of the present invention.

As illustrated in FIG. 5(a), the first via hole V1, the second via hole V2, the third via hole V3, and the fourth via hole V4 may be disposed on the same line in the width direction of the flexible printed circuit board. As illustrated in FIG. 5(b), the first via hole V1 and the third via hole V3 are disposed on the same first line L1 in the width direction, and the second via hole V2 and the fourth via hole V4 are disposed on the same second line L2 in the width direction. Here, the first line L1 and the second line L2 may be formed to alternate with each other.

As described above, when the plurality of via holes V1, V2, V3, and V4 are formed, the first central ground C1 and the second central ground C2 may improve a shielding effect. Thus, when the plurality of via holes V1, V2, V3, and V4 are formed to alternate with each other, a distance between the third via hole V3 and the fourth via hole V4, which are disposed in the shielding part 30, may be reduced to maximize the shielding effect.

Figure 6:
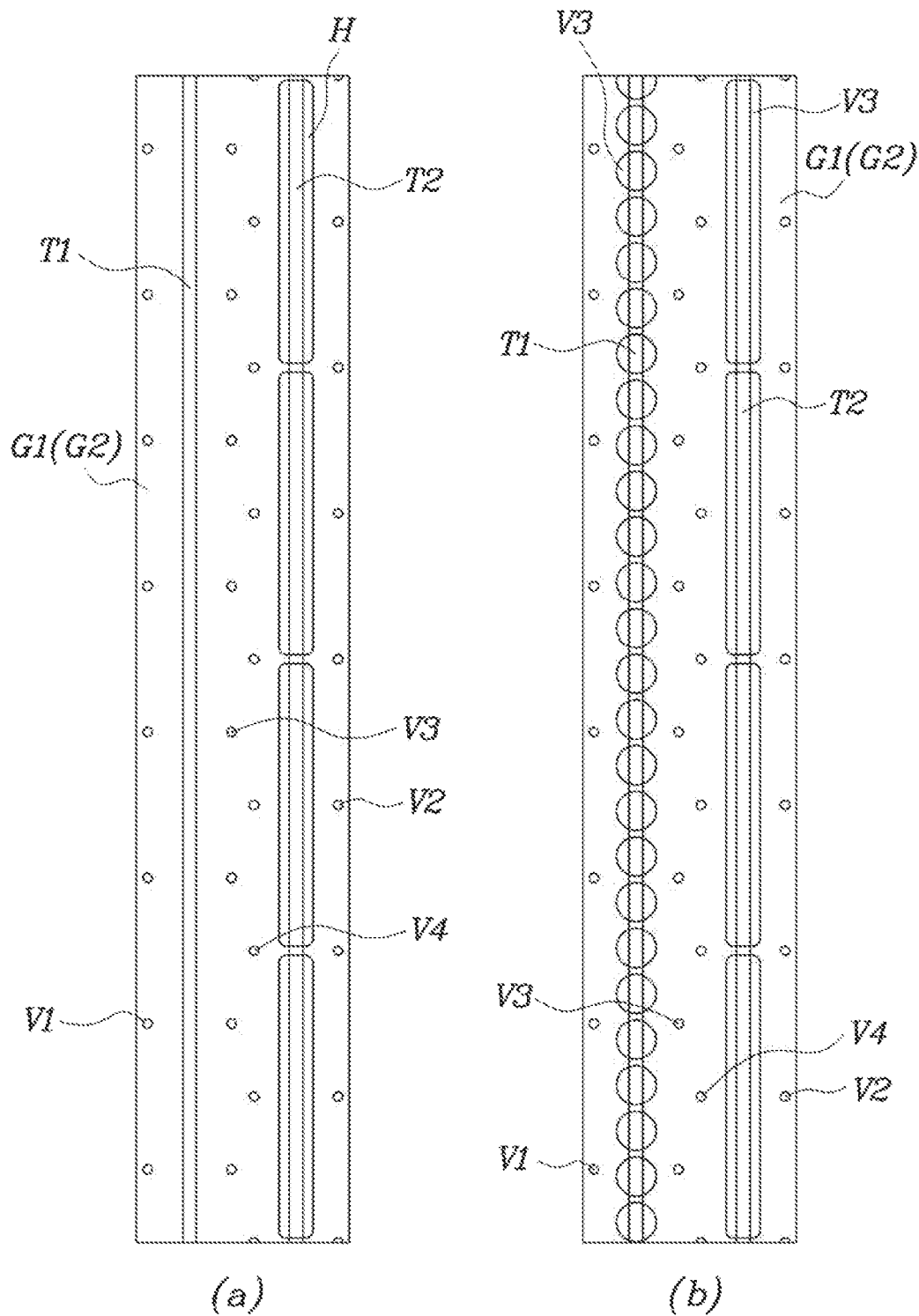
FIGS. 6(a) and 6(b) are views illustrating a ground hole of a flexible printed circuit board according to different embodiments of the present invention.

As illustrated in FIG. 6(a), in the flexible printed circuit board in which the first signal line T1 and the second signal line T2 are formed on layers different from each other, it is preferable that a rectangular ground hole H is formed in the first ground layer G1 or the second ground layer G2, which is disposed close to the first signal line T1 and the second signal line T2 in the vertical direction.

As illustrated in FIG. 6(b), it is preferable that a rectangular ground hole H is formed in the first ground layer G1 or the second ground layer G2, which is disposed close to the first signal line T1 and the second signal line T2, and a circular ground hole H is formed in the first ground layer G1 or the second ground layer G2, which is relatively remote. Thus, since each of the first signal line T1 and the second signal line T2 increases in area, the signal loss may be minimized FIGS. 7(a) to 7(d) are views illustrating the ground hole H of the flexible printed circuit board according to the first to fourth embodiments of the present invention.

Figure 7:
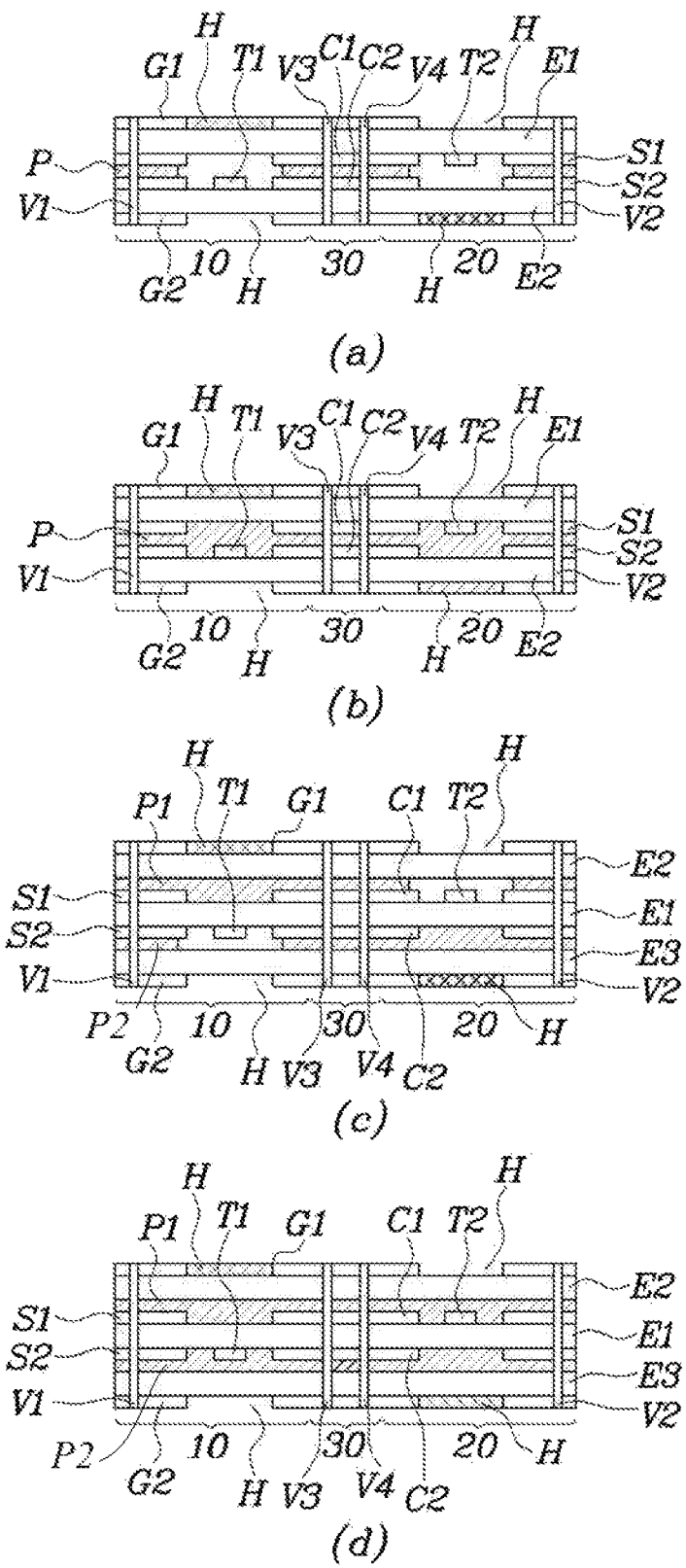
FIGS. 7(a) to 7(d) are views illustrating a ground hole of the flexible printed circuit board according to the first to fourth embodiments of the present invention.

As illustrated in FIGS. 7(a) and 7(b), when the ground hole H is formed in the flexible printed circuit board according to the first and second embodiments of the present invention, in the region of the first substrate part 10, the rectangular ground hole H is formed in the second ground layer G2 that is disposed close to the first signal line T1, and the circular ground hole H is formed in the first ground layer G1 that is disposed away from the first signal line T1. In the region of the second substrate part 20, the rectangular ground hole H is formed in the first ground layer G1 that is disposed close to the second signal line T2, and the circular ground hole H is formed in the second ground layer E2 that is disposed away from the second signal line T2.

As illustrated in FIGS. 7(c) and 7(d), when the ground hole H is formed in the flexible printed circuit board according to the third and fourth embodiments of the present invention, in the region of the first substrate part 10, the rectangular ground hole H is formed in the second ground layer G2 that is disposed close to the first signal line T1, and the circular ground hole H is formed in the first ground layer G1 that is disposed away from the first signal line T1. In the region of the second substrate part 20, the rectangular ground hole H is formed in the first ground layer G1 that is disposed close to the second signal line T2, and the circular ground hole H is formed in the second ground layer E2 that is disposed away from the second signal line T2.

Figure 8:
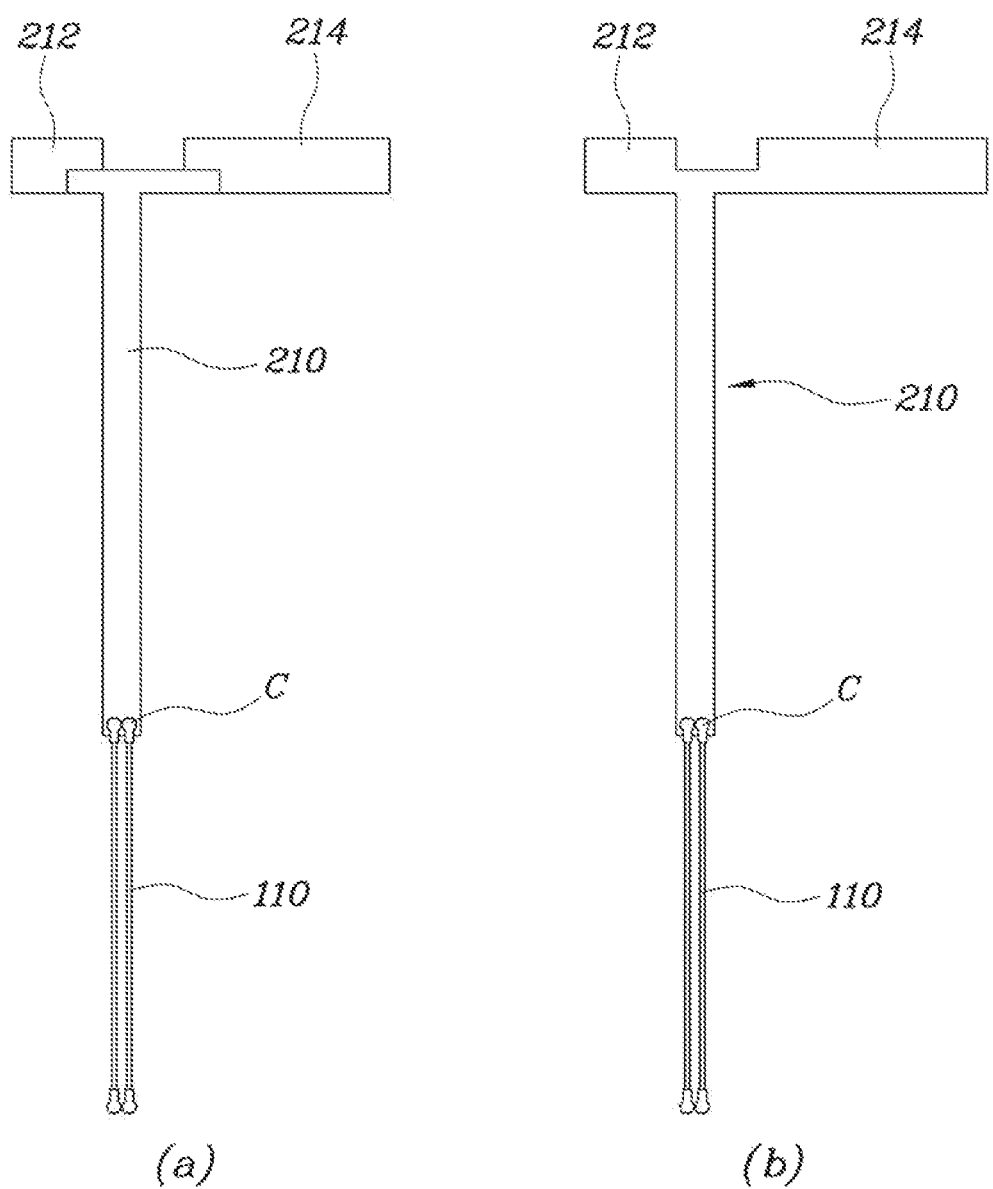
FIG. 8(a) is a view illustrating a state in which an antenna is coupled to the flexible printed circuit board according to the present invention.
FIG. 8(b) is a view illustrating a state in which the antenna is integrated with the flexible printed circuit board according to the present invention.

As illustrated in FIG. 8(a), a flexible printed circuit board 210 according to the present invention is connected to one end of a coaxial cable 110. In a wireless terminal in which the flexible printed circuit board 210 having a predetermined length or more such as a notebook is required, assembly may be easy, the flexible printed circuit board 210 may be minimized in length, signal loss may be reduced, and manufacturing costs may be reduced.

The flexible printed circuit board 210 is connected to the coaxial cable 110 through one selected from a connector C or soldering. The flexible printed circuit board 210 has a "T" shape, and a first antenna 212 and a second antenna 214 are connected to both ends of the flexible printed circuit board 210.

It is preferable that the first antenna 212 connected to the flexible printed circuit board 210 transmits and receives a short distance communication signal such as WIFI, and the second antenna 214 transmits and receives a wireless mobile communication signal such as 3G and 4G.

Also, it is preferable that one end of both ends of the flexible printed circuit board 210, which is connected to the first antenna 212, has a length greater than that of the other end connected to the second antenna 214 in order to minimize signal interference of the first antenna 212 and the second antenna 214.

As illustrated in FIG. 8(b), the flexible printed circuit board 210 according to the present invention may further include a first antenna 212 and a second antenna 214, which extend from both ends of the flexible printed circuit board 210 in a left and right direction. That is, the first antenna 212 and the second antenna 214 are integrated with both the ends of the flexible printed circuit board 210.

Here, in order to minimize signal interference of the first antenna 212 and the second antenna 214, the flexible printed circuit board is formed in a "F" shape. Also, it is preferable that a position from which the second antenna 214 is formed to extend is disposed far away from a center of the flexible printed circuit board 210 in a vertical direction when compared to the position from which the first antenna 212 is formed to extend.

While the present invention has been particularly shown and described with reference to exemplary embodiments thereof, the present invention is not limited to the flexible printed circuit board according to the present invention, and it will be apparent to those skilled in the art that variations and modifications may be made without departing from the scope of the present invention.

It will be understood by those skilled in the art that various changes in form and details may be made therein without departing from the spirit and scope of the invention as defined by the appended claims.

DESCRIPTION OF THE SYMBOLS

10: First substrate part 20: Second substrate part
30: Shielding part
E1: First dielectric layer E2: Second dielectric layer
E3: Third dielectric layer G1: First ground layer
G2: Second ground layer S1: First side ground
S2: Second side ground C1: First central ground
C2: Second central ground T1: First signal line
T2: Second signal line P: Coupling part
P1: First coupling part P2: Second coupling part
V1: First via hole V2: Second via hole
V3: Third via hole V4: Fourth via hole
L1: First line L2: Second line
H: Ground hole

The invention claimed is:
1. A flexible printed circuit board, comprising:
a first substrate part comprising a first signal line;
a second substrate part comprising a second signal line parallel to the first signal line,
wherein the first substrate part and the second substrate part are disposed on a same plane with a shielding part therebetween;
a first dielectric layer;
a second dielectric layer disposed to be spaced a first predetermined distance from the first dielectric layer in a vertical direction;
a pair of first side grounds laminated to be spaced a second predetermined distance from each other on a bottom surface of the first dielectric layer;
a pair of second side grounds laminated to be spaced a third predetermined distance from each other on a plane of the second dielectric layer;
a first central ground disposed between the pair of first side grounds and laminated on the bottom surface of the first dielectric layer;
a second central ground disposed between the pair of second side grounds and laminated on the plane of the second dielectric layer,
wherein the first signal line and the second signal line are disposed with the first central ground and the second central ground therebetween,
wherein the first substrate part includes one of the pair of first side grounds and one of the pair of second side grounds, and the second substrate part includes another of the pair of first side grounds and another of the pair of second side grounds, and
wherein each of the pair of first side grounds and each of the pair of second side grounds are respectively coupled to each other by using a coupling part as a medium, the coupling part being a single layer and consisting of dielectric material.

2. The flexible printed circuit board of claim 1, wherein the first signal line is disposed between one of the pair of second side grounds and the second central ground, and formed on the plane of the second dielectric layer, and
the second signal line is disposed between one of the pair of first side grounds and the first central ground, and formed on the bottom surface of the first dielectric layer.

3. The flexible printed circuit board of claim 2, wherein a first ground layer is laminated on a plane of the first dielectric layer,
a second ground layer is laminated on a bottom surface of the second dielectric layer, and
facing surfaces of the first dielectric layer and the second dielectric layer, the first central ground and the second central ground are respectively coupled to each other by using the coupling part as the medium.

4. The flexible printed circuit board of claim 2,
wherein a first ground layer is laminated on a plane of the first dielectric layer,
a second ground layer is laminated on a bottom surface of the second dielectric layer, and
the first central ground and the second central ground are respectively coupled to each other by using the coupling part as the medium, and
wherein an air layer is formed in a space through which the first dielectric layer and the second dielectric layer face each other so that the first signal line and the second signal line are exposed to the air layer.

5. The flexible printed circuit board of claim 1, further comprising:
a first via hole formed to pass through the first substrate part in a vertical direction;
a second via hole formed to pass through the second substrate part in the vertical direction; and third and fourth via holes passing through the shielding part in the vertical direction and formed to be spaced a predetermined distance from each other in a width direction.

6. The flexible printed circuit board of claim 5, wherein the first via hole to the fourth via hole are disposed on a same line in the width direction.

7. The flexible printed circuit board of claim 5,
wherein the first via hole and the third via hole are disposed on a same first line in the width direction, the second via hole and the fourth via hole are disposed on a same second line in the width direction,
wherein the flexible printed circuit board further comprises a plurality of first via holes including the first via hole, a plurality of second via holes including the second via hole, a plurality of third via holes including the third via hole, and a plurality of fourth via holes including the fourth via hole,
wherein respective first via holes and third via holes are disposed on a plurality of first lines in the width direction,
wherein respective second via holes and respective fourth via holes are disposed on a plurality of second lines in the width direction, and
wherein respective first lines and respective second lines are formed to alternate with each other.

8. The flexible printed circuit board of claim 1, wherein a plurality of circular ground holes are formed to be spaced a predetermined distance from each other in a longitudinal direction of the first signal line in a first ground layer disposed on a plane of the first signal line,
a plurality of rectangular ground holes are formed to be spaced a predetermined distance from each other in a longitudinal direction of the second signal line in the first ground layer disposed on a plane of the second signal line,
a plurality of rectangular ground holes are formed to be spaced a predetermined distance from each other in the longitudinal direction of the first signal line in a second ground layer disposed on a bottom surface of the first signal line, and
a plurality of circular ground holes are formed to be spaced a predetermined distance from each other in the longitudinal direction of the second signal line in the second ground layer disposed on a bottom surface of the second signal line.

9. The flexible printed circuit board of claim 1, wherein a coaxial cable is connected to one end of each of the first signal line and the second signal line.

10. The flexible printed circuit board of claim 9, wherein another end of each of the first signal line and the second signal line extends in a left and right direction to form a "T" shape.

11. The flexible printed circuit board of claim 10, wherein a first antenna and a second antenna are respectively coupled to respective ends of the "T" shape that are extended in the left and right direction.

12. The flexible printed circuit board of claim 10, wherein a first antenna and a second antenna are formed to respectively extend from respective ends of the "T" shape that are extended in the left and right direction.

13. A flexible printed circuit board, comprising:
a first substrate part comprising a first signal line;
a second substrate part comprising a second signal line parallel to the first signal line,
wherein the first substrate part and the second substrate part are disposed on a same plane with a shielding part therebetween;
a first dielectric layer;
a second dielectric layer disposed to be spaced a first predetermined distance from the first dielectric layer in a vertical direction;
a third dielectric layer spaced a second predetermined distance from the second dielectric layer in the vertical direction, wherein the third dielectric layer and the second dielectric layer are disposed with the first dielectric layer therebetween;
a pair of first side grounds laminated to be spaced a third predetermined distance from each other on a plane of the first dielectric layer;
a pair of second side grounds laminated to be spaced a fourth predetermined distance from each other on a bottom surface of the first dielectric layer;
a first central ground disposed between the pair of first side grounds and laminated on the plane of the first dielectric layer; and
a second central ground disposed between the pair of second side grounds and laminated on the bottom surface of the first dielectric layer,
wherein the first signal line and the second signal line are disposed with the first central ground and the second central ground therebetween,
wherein the first substrate part includes one of the pair of first side grounds and one of the pair of second side grounds, and the second substrate part includes another of the pair of first side grounds and another of the pair of second side grounds,
wherein the first signal is formed directly onto the bottom surface of the first dielectric layer and the second signal line is formed directly onto the plane of the first dielectric layer, and wherein the plane of the first dielectric layer is a surface of the first dielectric layer opposite to the bottom surface.

14. The flexible printed circuit board of claim 13, wherein the first signal line is disposed between one of the pair of second side grounds and the second central ground, and
the second signal line is disposed between one of the pair of first side grounds and the first central ground.

15. The flexible printed circuit board of claim 14, wherein a first ground layer is laminated on a plane of the second dielectric layer,
a second ground layer is laminated on a bottom surface of the third dielectric layer,
facing surfaces of the first dielectric layer and the second dielectric layer, facing surfaces of the first central ground and the second dielectric layer, facing surfaces of each of the pair of first side grounds and the second dielectric layer, and facing surfaces of the second signal line and the second dielectric layer are coupled to each other by using a first coupling part as a medium, and
facing surfaces of the first dielectric layer and the third dielectric layer, facing surfaces of the second central ground and the third dielectric layer, facing surfaces of each of the pair of second side grounds and the third dielectric layer, and facing surfaces of the first signal line and the third dielectric layer are coupled to each other by using a second coupling part as a medium.

16. The flexible printed circuit board of claim 14, wherein a first ground layer is laminated on a plane of the second dielectric layer,
a second ground layer is laminated on a bottom surface of the third dielectric layer, and an air layer is formed between the first dielectric layer on which the first signal line is formed and the third dielectric layer and between the first dielectric layer on which the second signal line is formed and the second dielectric layer so that the first signal line and the second signal line are exposed to the air layer.

* * * * *